(12) United States Patent
Walter et al.

(10) Patent No.: US 6,338,413 B1
(45) Date of Patent: Jan. 15, 2002

(54) MASS CUSTOMIZATION TELECOMMUNICATIONS EQUIPMENT RACK

(75) Inventors: Jonathan T. Walter, Wake Forest; Bryan C. Caudill, Raleigh; Gilbert W. Reece, Wake Forest, all of NC (US)

(73) Assignee: Newton Instrument Company, Inc., Butner, NC (US)

( * ) Notice: Subject to any disclaimer, the term of this patent is extended or adjusted under 35 U.S.C. 154(b) by 0 days.

(21) Appl. No.: 09/587,178

(22) Filed: Jun. 2, 2000

(51) Int. Cl.[7] .................................................. A47F 5/00
(52) U.S. Cl. ..................... 211/26; 211/189; 361/829; 361/683; 312/265.1; 312/265.4
(58) Field of Search ................ 211/26, 189; 312/265.1, 312/265.2, 265.3, 265.4, 265.5, 265.6; 361/727, 829, 683

(56) References Cited

U.S. PATENT DOCUMENTS

| | | | |
|---|---|---|---|
| 4,715,502 A | | 12/1987 | Salmon |
| 4,860,168 A | | 8/1989 | Wiljanen et al. |
| 5,004,107 A | | 4/1991 | Sevier et al. |
| 5,233,129 A | * | 8/1993 | Hall |
| 5,284,254 A | * | 2/1994 | Rinderer ........................ 211/26 |
| 5,323,916 A | | 6/1994 | Salmon |
| 5,645,174 A | | 7/1997 | Reiger et al. |
| 5,819,956 A | * | 10/1998 | Rinderer ........................ 211/26 |
| 5,975,315 A | * | 11/1999 | Jordan ..................... 211/189 X |
| 5,983,590 A | * | 11/1999 | Serban ....................... 211/26 X |
| 6,006,925 A | * | 12/1999 | Sevier .......................... 211/26 |
| 6,102,214 A | * | 8/2000 | Mendoza ....................... 211/26 |
| 6,179,133 B1 | * | 1/2001 | Reece ..................... 361/829 X |
| 6,202,860 B1 | * | 3/2001 | Ludwig ........................ 211/26 |
| 6,213,577 B1 | * | 4/2001 | Rooyakkevs et al. .... 312/265.3 |

* cited by examiner

Primary Examiner—Robert W Gibson, Jr.
(74) Attorney, Agent, or Firm—Jenkins & Wilson, P.A.

(57) ABSTRACT

A rack assembly for mounting telecommunications equipment is provided which will accommodate both Network Bays and UFER Bays and which provides mounting strips secured at the front and rear corners of the upright channels to better accommodate mounting digital equipment in the rack assembly.

15 Claims, 8 Drawing Sheets

FIG. I

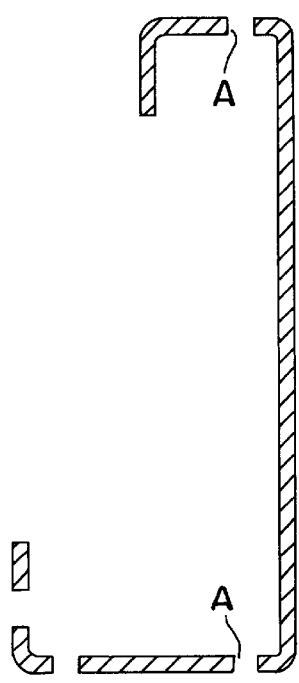 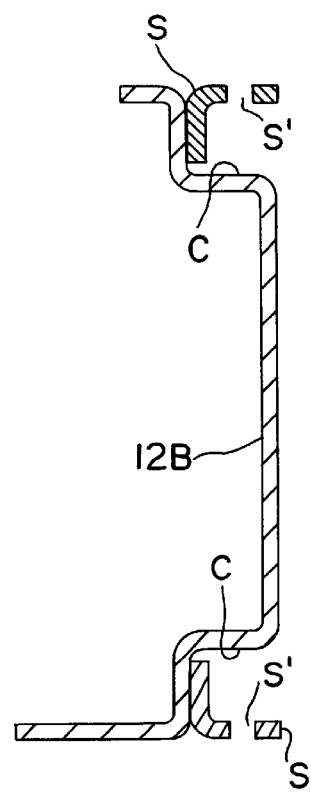
FIG. 3A
PRIOR ART
FIG. 3B

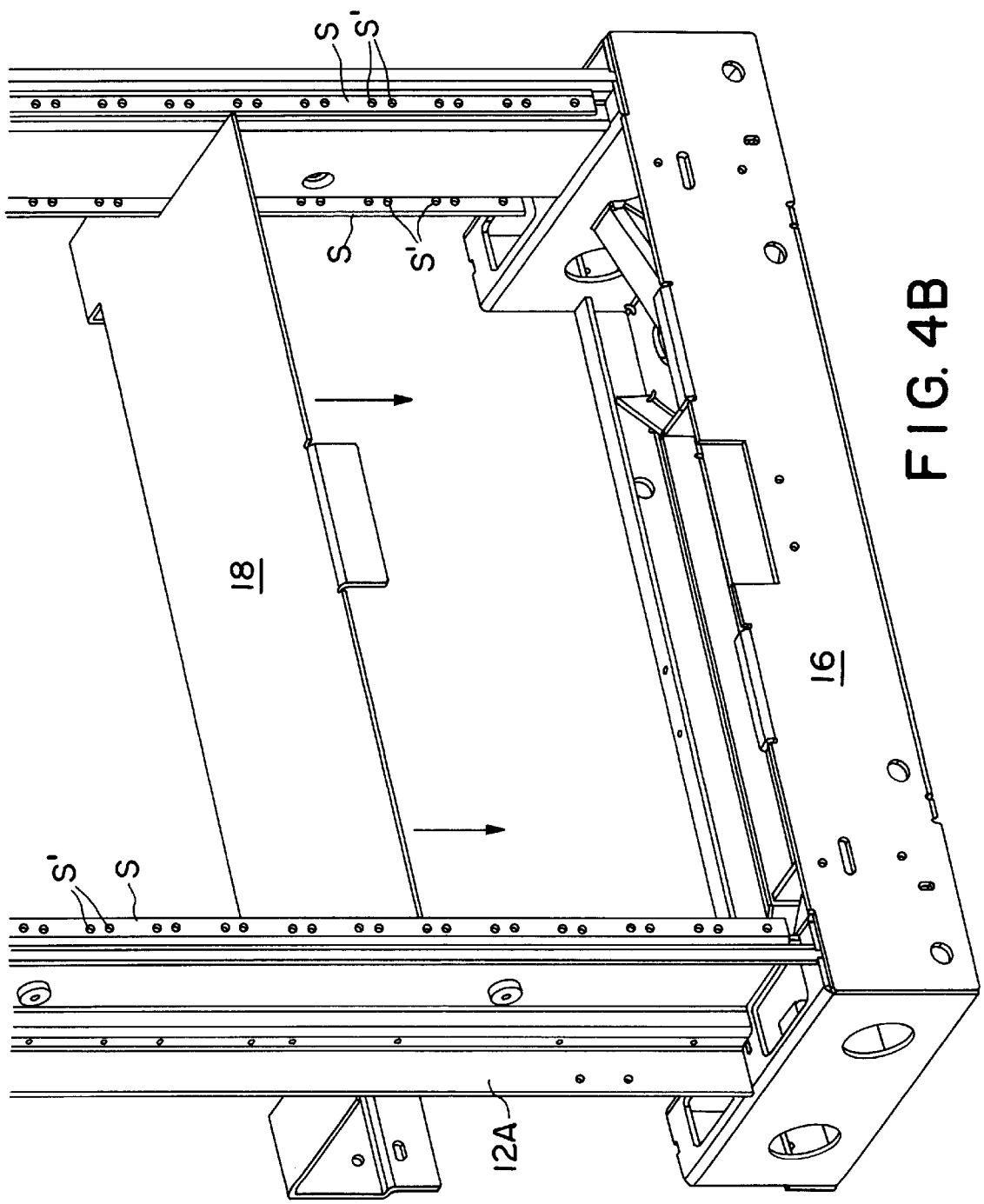

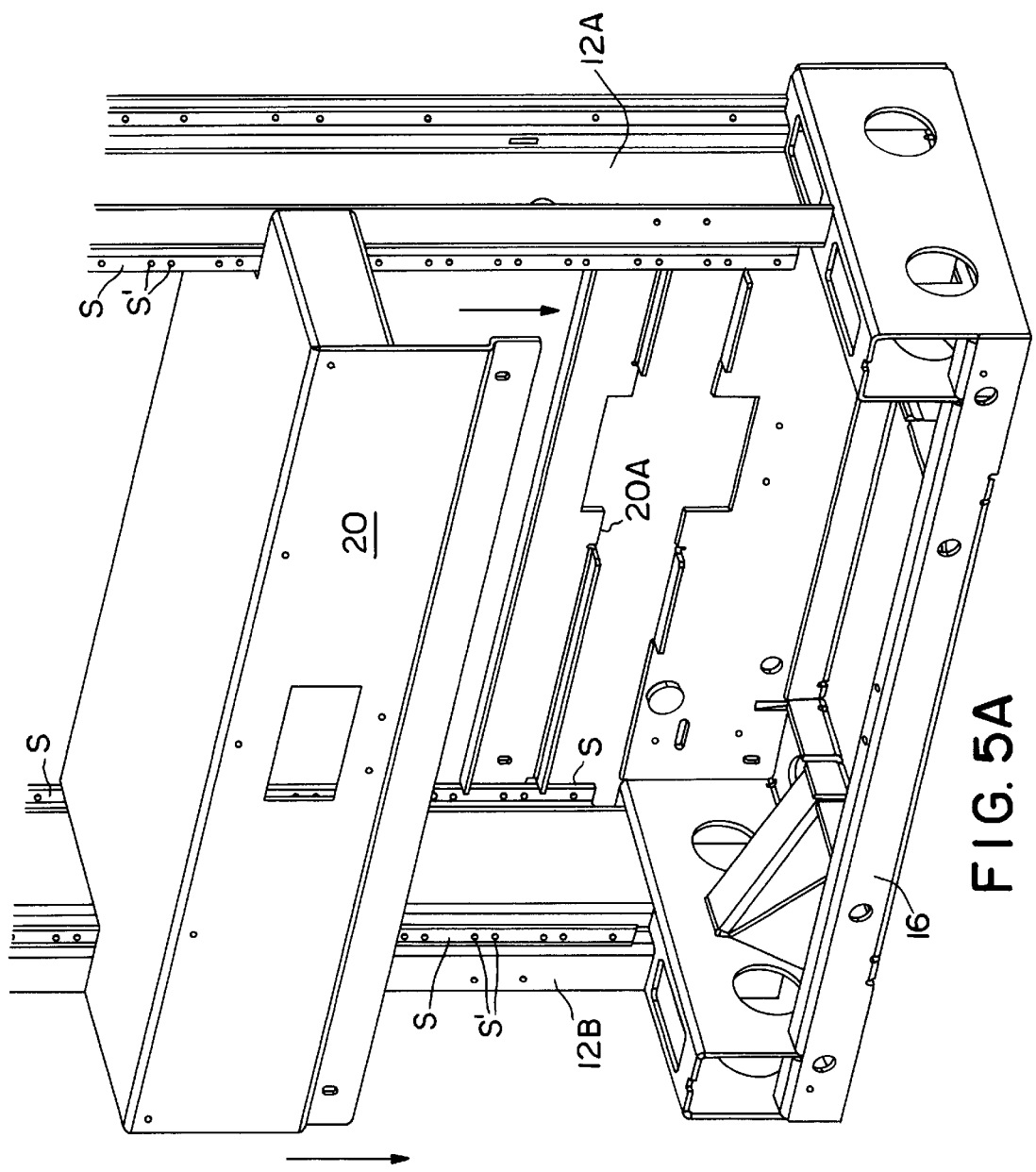

MASS CUSTOMIZATION TELECOMMUNICATIONS EQUIPMENT RACK

TECHNICAL FIELD

The present invention relates to racks or bays used primarily for mounting and housing telecommunications equipment, and more specifically to an improved rack for mounting telecommunications equipment which allows for mounting digital equipment in the rack and the selection of either a Network Bay base or a UFER base in accordance with customer order.

RELATED ART

Telecommunications equipment racks or bays are typically installed in controlled environment vaults, central switching offices, and remote switch buildings. As known to those in the telecommunications field, equipment racks or bays can be ordered in many different sizes and configurations. Generally speaking, unequal flange equipment racks (UFERs) can be ordered with either a relatively lower bottom profile Network Bay base or with a relatively higher profile UFER base. Further, unequal flange equipment racks or bays are manufactured in a variety of widths and heights in order to accommodate the needs of customers. As is also well-known in the telecommunications industry, unequal flange equipment racks or bays have previously been constructed to accommodate traditional non-digital equipment, and the slightly wider digital telecommunications equipment does not readily mount in conventional unequal flange equipment racks. The problem with designing new wider equipment racks for the digital equipment is that the horizontal space between the upright supports must be increased by 0.25 inches but the horizontal spacing between the mounting holes must remain the same as prior unequal flange equipment racks in which the mounting holes are provided in the front and back flange of each upright support.

The present invention is intended to provide a mass customization rack that will accommodate digital telecommunications equipment by providing a full 0.25 inch wider mounting space while maintaining the original horizontal spacing between mounting holes. Further, the mass customization rack of the present invention is manufactured so as to interchangeably accommodate either the low profile Network Bay base or the higher profile UFER base in accordance with customer specification.

Summarily, the novel rack of the present invention is constructed so as to be able to accommodate digital telecommunications equipment with conventional horizontally spaced apertures provided by the rack as well as to allow for the attachment of either a Network Bay base or a UFER base during manufacturing in accordance with customer requirements. The resulting telecommunications rack possesses a unique ability to accommodate mounting of digital telecommunications equipment as well as provide a generic construction that simplifies the manufacturing process for the equipment rack. Thus, the new mass customization rack reduces the manufacturer's need to stock a variety of conventional bays and racks, and meets a long-felt need in the telecommunications industry for an unequal flange equipment rack that can accommodate both non-digital and digital telecommunications equipment.

DISCLOSURE OF THE INVENTION

In accordance with the present invention, applicant provides a new rack assembly for mounting telecommunications equipment designed specifically to accommodate both non-digital and digital telecommunications equipment as well as to interchangeably accept both a Network Bay base and UFER base to reduce the need for the conventional proliferation of differently sized and featured equipment bays and racks. The rack assembly comprises a pair of upstanding spaced-apart frame members with a generally U-shaped crosssection and having a web with a bottom and a relatively short side portion on one side and a relatively long portion on the other side, and wherein each of the frame members are outwardly directed relative to the other frame member such that each of the frame members forms a front and rear corner at the juncture of the web bottom with the long and short web side portions, respectively. A plurality of strips are mounted to a corresponding plurality of the front and rear corners, and each of the strips defines a plurality of vertically spaced-apart mounting apertures therein. A horizontal frame member is secured at each opposing end to the upper end of a respective one of the pair of upstanding spaced-apart frame members, and a base is provided at the bottom of the rack assembly and extending between the lower ends of the pair of upstanding spaced-apart frame members which is interchangeable from a Network Bay base to a UFER base.

Thus, it is an object of the present invention to provide an individual rack assembly which is adapted so as not to assume its final configuration until after the receipt of a customer order.

It is another object of the present invention to provide a rack assembly which can accept generic weldments and other critical components subsequent to receipt of a customer order so as to allow a decrease in order lead time.

It is another object of the present invention to provide a rack assembly that is adapted for mass customization so as to streamline the rack assembly manufacturing requirements.

It is still another object of the present invention to provide a rack assembly that utilizes a single weldment for both Network Bays and UFERs.

It is still another object of the present invention to provide a rack assembly which utilizes mounting strips at each of the four corners thereof in order to provide mounting apertures closer to the corners of the upstanding frame members.

It is still another object of the present invention to provide a rack assembly that allows for increased width between the upstanding frame members while maintaining the same horizontal spacing between mounting apertures.

Some of the objects of the invention having been stated hereinabove, other objects will become evident as the description proceeds, when taken in connection with the accompanying drawings as best described hereinbelow.

BRIEF DESCRIPTION OF THE DRAWINGS

FIG. 3A is a horizontal cross-sectional view through one of the upstanding frame members of a conventional equipment rack depicting the location of the front and rear flange mounting holes or apertures therein;

FIG. 3B is a horizontal cross-sectional view through one of the upstanding frame members of the improved equipment rack of the present invention showing the location of the mounting strips at the front and back corners thereof and the location of the holes or apertures in each of the mounting strips;

FIG. 4B is a rear perspective view of the improved equipment rack shown in FIG. 4A;

FIG. 5A is a front perspective view of the bottom of the improved equipment rack of the present invention with a UFER base about to be mounted thereto;

BEST MODE FOR CARRYING OUT THE INVENTION

Figure 1:
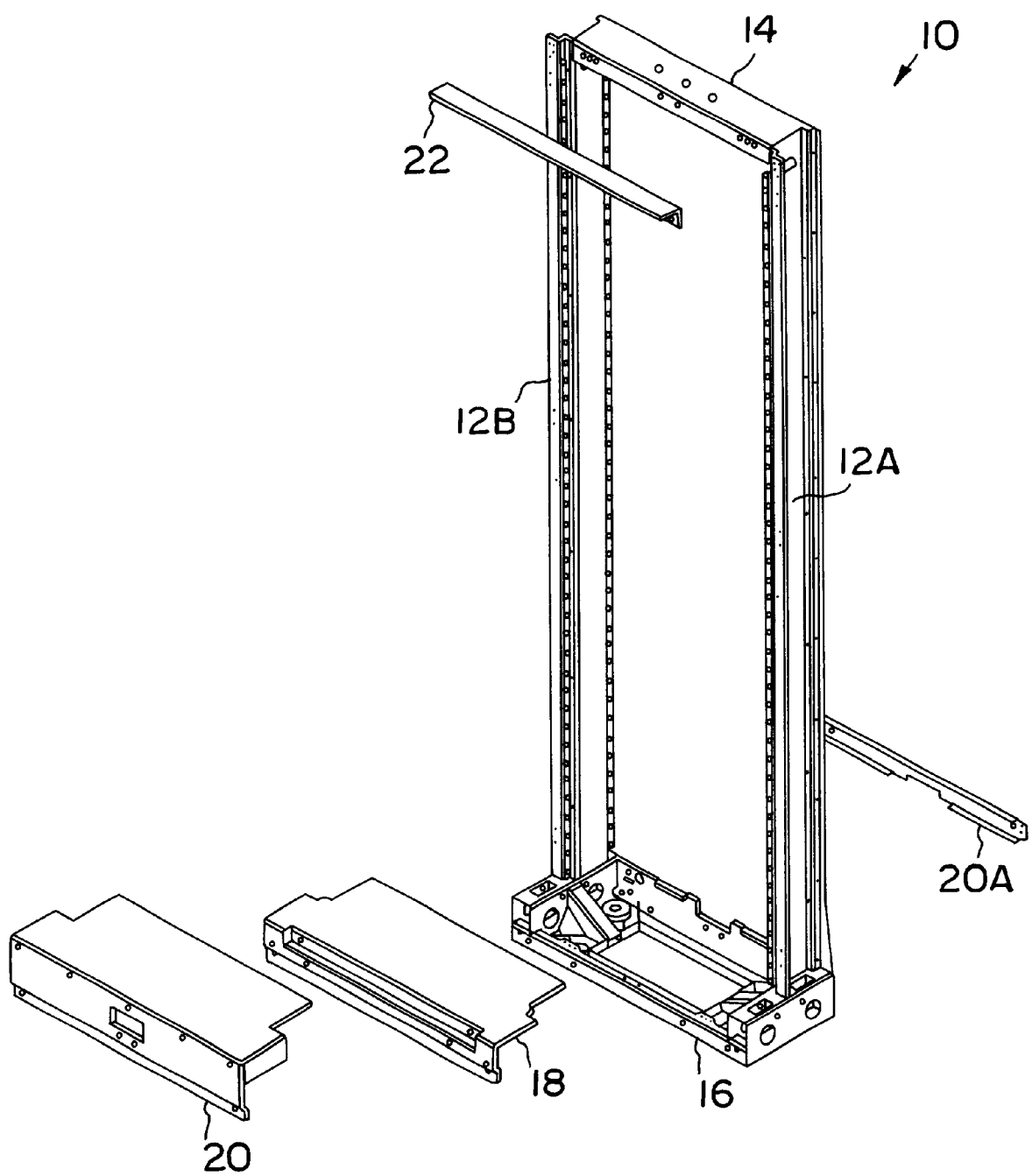
FIG. 1 is an exploded perspective view of the improved rack assembly constructed in accordance with the present invention.
Figure 2:
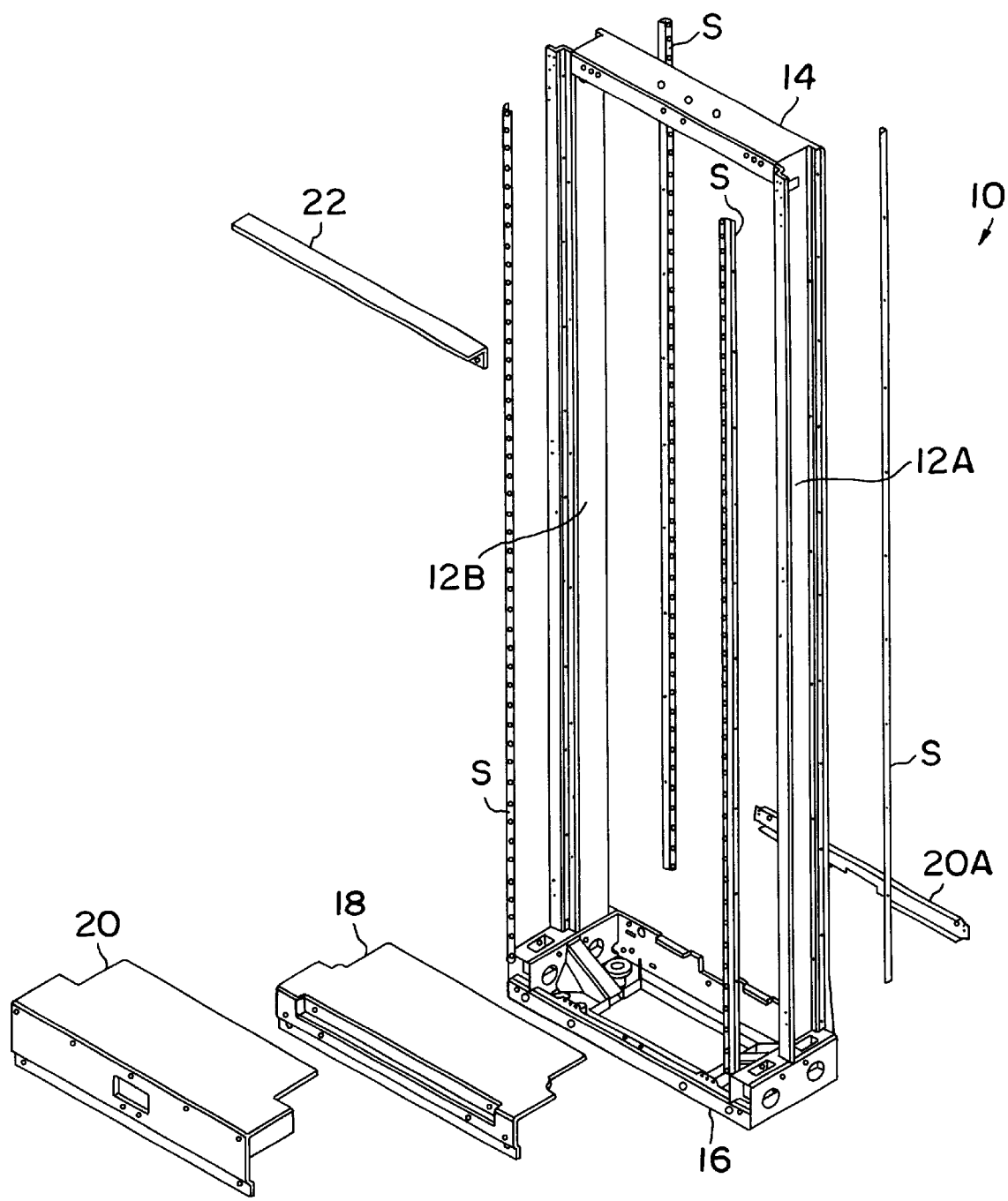
FIG. 2 is an exploded perspective view similar to FIG. 1 wherein the mounting strips of the rack assembly are shown removed from the equipment rack for better clarity of understanding.
Figure 4A:
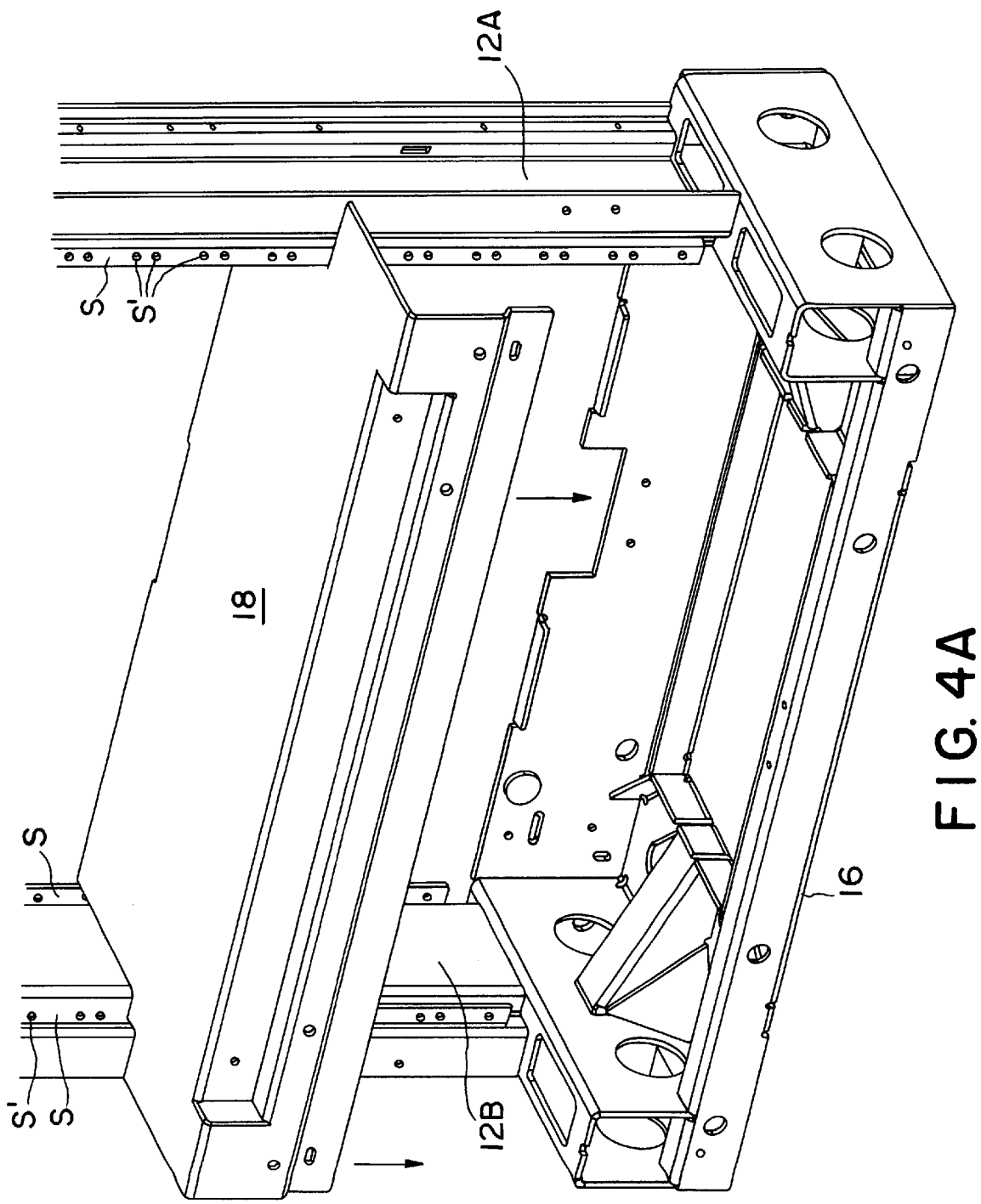
FIG. 4A is a front perspective view of the bottom of the improved equipment rack of the present invention with a Network Bay base being mounted thereto.
Figure 5B:
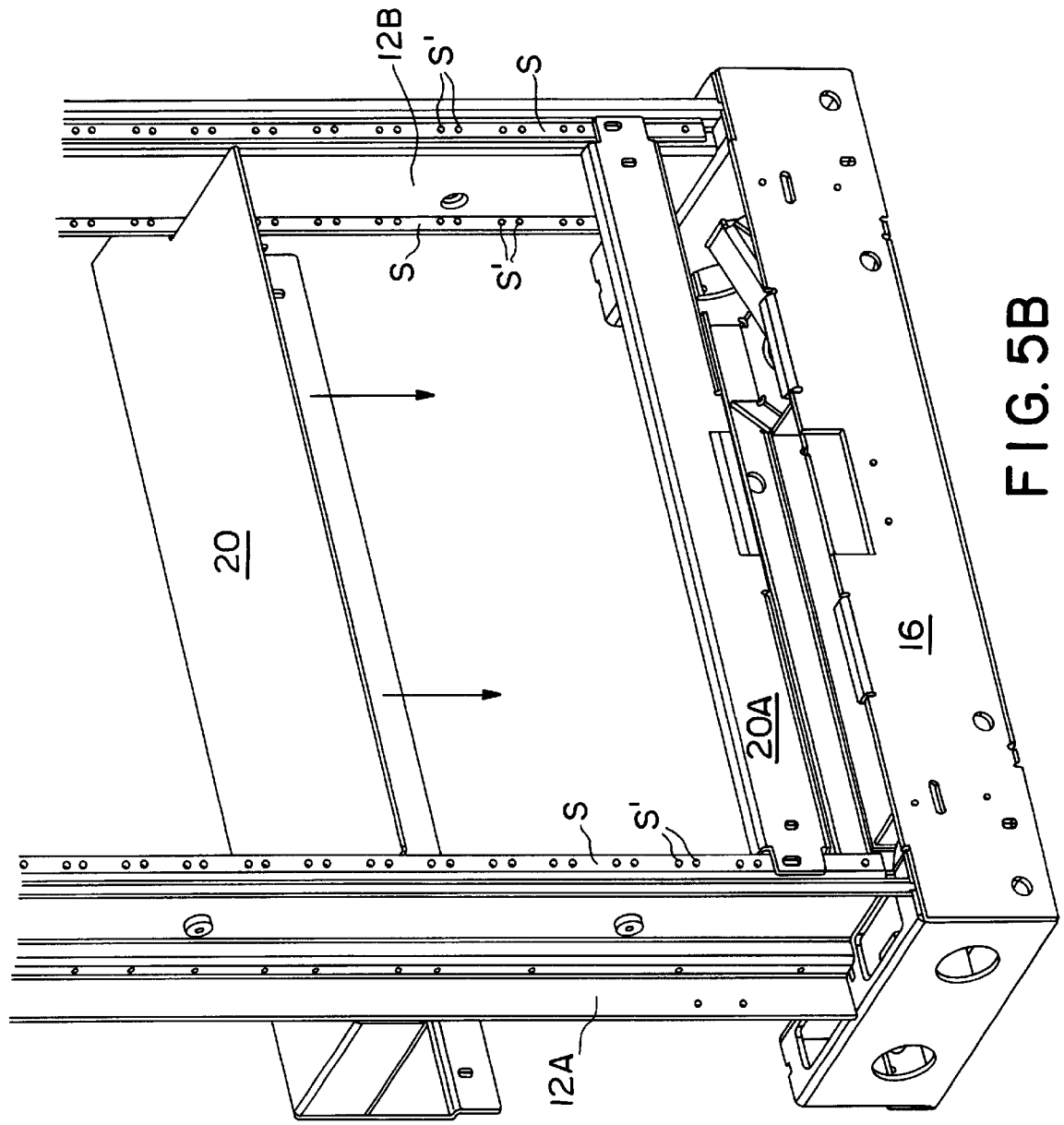
FIG. 5B is a rear perspective view of the improved equipment rack of the present invention shown in FIG. 5A.

Referring now to FIGS. 1–5A, 5B of the drawings, the mass customization equipment rack of the present invention is shown and generally designated 10. Equipment rack 10 is constructed from two upright metal channels 12A, 12B joined by a horizontal metal channel crossbar 14 at the top and a base or base weldment 16 at the bottom thereof to which either Network Bay base cover 18 or UFER base cover 20 may be interchangeably attached by suitable screws (not shown). If UFER bay cover 20 is attached to base 16, a UFER bay back rail 20A will be used to close the gap between base 16 and UFER bay cover 20 as best seen in FIG. 5B. Also, top angle 22 may be optionally affixed to equipment rack 10 if desired to meet a customer order requirement.

Referring now particularly to FIGS. 3A, 3B; 4A, 4B; and 5A, 5B of the drawings, it can be appreciated that equipment rack 10 includes longitudinally extending channels C defined at the front and rear corners of each of upright metal channels 12A, 12B (see particularly FIG. 3B). Longitudinally extending channels C are provided at the front and rear corners of each of upright metal channels 12A, 12B where heretofore conventional upright metal channels included a front and rear corner and the unequal flanges of each of the uprights defined mounting apertures A therein. Provided within at least two and preferably all four of longitudinally extending channels C is a corresponding mounting strip S that is affixed to the corresponding channel C by riveting or other suitable affixation means. Mounting strips S as best seen in FIGS. 2, 3B, 4A, 4B and 5A, 5B each define a plurality of spaced-apart mounting holes or apertures S' along the longitudinally extending length thereof. During the manufacture of a particular rack assembly 10 for a customer, mounting strips S can be affixed to upright metal channels 12A, 12B that possess holes or apertures S' therein having a desired or specific spacing as requested by that customer. Mounting holes or apertures S' in mounting strips S are used to facilitate mounting of equipment within equipment rack 10 by means of conventional screws or bolts to secure a piece of telecommunications equipment to the mounting strips S of the equipment rack. The advantages of the novel channel and strip configuration used in equipment rack 10 will be described in more detail hereinbelow so that the advantageous benefits thereof can be fully appreciated.

Conventional unequal flange equipment racks (see FIG. 3A) successfully provide adequate mounting hole and upright spacing for conventional 21.5 inch and 17.5 inch wide telecommunications equipment. However, as is well known to those in the telecommunications equipment rack art, as digital information transfer becomes more popular and more common in traditional central switching office environments, so does the requirement to house digital equipment in unequal flange racks. However, digital equipment is often 0.25 inches wider (e.g., 21.75 inches and 17.75 inches wide) than previous telecommunications non-digital switching equipment, while maintaining the same equipment mounting hole distances of 22.312 inches and 18.312 inches. Thus, conventional equipment racks will many times not accommodate digital telecommunications equipment. In order to accommodate digital telecommunications equipment, an equipment rack must provide the additional 0.25 inches in width for the equipment but the mounting hole spacing must remain the same as in conventional equipment racks. This can result in a quandary since the tapped mounting holes (see FIG. 3A) of the upright channels would have to be moved closer to the bend at the inside front and rear corners of a wider conventional rack. However, due to material deformation caused by the local bending of the metal of the upright channels, the mounting holes or mounting apertures therein would tend to deform to such an extent as to be rendered unuseable. This problem has been solved by rack assembly 10 of the present invention by utilizing secondary mounting strips S in longitudinally extending channels C at the front and back inside corners of upright channels 12A, 12B so as to allow the mounting holes or mounting apertures S' to be relatively closer to the inner wall of upright channels 12A, 12B (see FIGS. 3A and 3B). As can be appreciated with reference to FIGS. 3A and 3B of the drawings, mounting hole S' can be provided closer to the equipment side of upright 12B than the mounting hole A in conventional upright shown in FIG. 3A. Therefore, the mounting space between upright channels 12A, 12B can be increased by the desired 0.25 inches in width to accommodate mounting of digital telecommunications equipment therebetween while the horizontal distance between mounting holes S' is maintained the same by laterally shifting of mounting holes S' inwardly toward the equipment side of upright channels 12A, 12B with strips S.

Also, conventional unequal flange equipment racks typically incorporate two product families to perform the same function (e.g., the UFER and Network Bay families). The two similar equipment racks are essentially redundant and differ only with the Network Bay providing several more mounting locations than the UFER bay. The reason for this difference is that the Network Bay bay employs a 4-inch tall base and the UFER bay employs a 6-inch tall base for a conventional equipment rack. Whereas conventional equipment racks provide a solution to the Network Bay and UFER bay difference by offering two completely separate equipment rack products built from separate components, equipment rack 10 of the present invention is manufactured so as to accommodate interchangeable UFER cover 20 and Network Bay cover 18 upon base weldment 16 in accordance with customer order specifications. The ability of rack assembly 10 of the present invention to interchangeably accommodate either Network Bay cover 18 or UFER bay cover 20 upon the base thereof (utilizing UFER back rail 20A as necessary to accommodate UFER cover 20) obviates the necessity to manufacture and inventory two separate families of equipment racks to provide UFERs and Network Bays.

Therefore, rack assembly 10 possesses many advantages over conventional rack including the following:

1. Rack 10 can be used as either a Network Bay or UFER.
2. Mounting strips S affixed to upright channels 12A, 12B can vary from customer to customer in accordance with customer requirements.
3. Rack assembly 10 can be manufactured so as to provide a 0.25 inch wider equipment opening while still maintaining conventional horizontal spacing between mounting holes S'.
4. Rack assembly 10 allows for one basic rack product to be manufactured and interchangeable covers to be added to create either a UFER base or Network Bay base so as to reduce manufacturing complexity and equipment rack inventory of the manufacturer.
5. Mounting strips S provide better grounding than conventional equipment rack mounting holes since strips S are unpainted and apertures S' are not surrounded, and often filled, by paint as are the mounting holes of conventional equipment racks.

ALTERNATIVE EMBODIMENTS

Figure 6A:
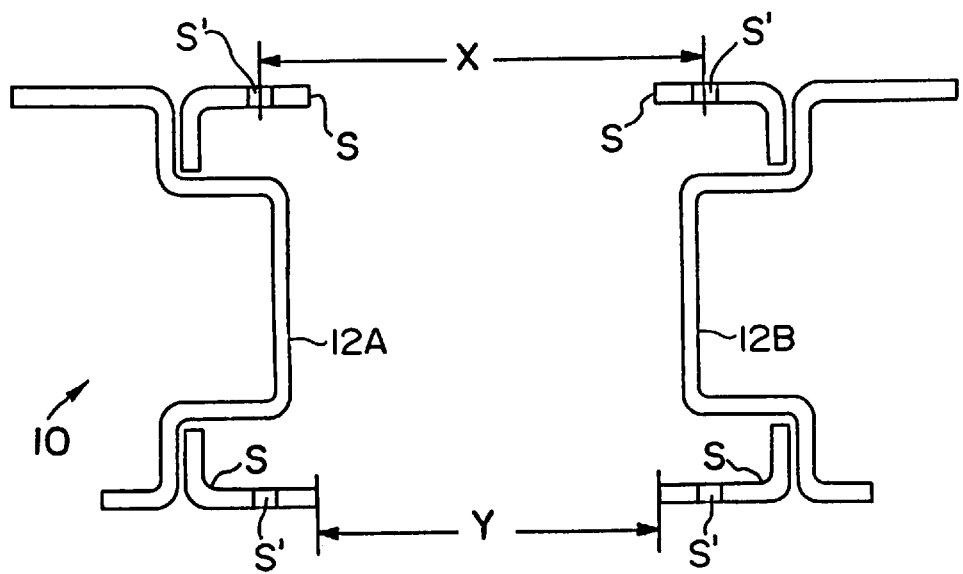
FIG. 6A is a horizontal cross-sectional view similar to FIG. 3B depicting the X distance (equipment mounting hole distance) and the Y distance (equipment mounting opening or aperture distance) in accordance with standard field of the art nomenclature.

To better explain and to reiterate the functionality of the present invention, reference is now made to FIG. 6A of the drawings illustrating a cross-sectional view of equipment rack 10 (the embodiment of the invention described hereinabove) constructed from two upright metal channels 12A, 12B and having mounting strips S affixed (typically by riveting) thereto. Mounting holes or apertures S' are shown therein for better clarity of understanding. As can be noted with reference to FIG. 6A, distance X indicates the equipment mounting hole distance and distance Y indicates the width of the equipment mounting space or aperture. Traditionally, distance Y is 21.5 inches or 17.5 inches, and traditionally distance X is 22.312 (22 5/16) inches or 18.312 (18 5/16) inches. As is known to those familiar with telecommunications equipment racks, digital telecommunications equipment requires the same X value but necessitates an additional 0.25 inches in the Y value. This has posed a considerable difficulty to conventional equipment racks, but equipment rack 10 of the present invention is intended to overcome this problem.

Figure 6B:
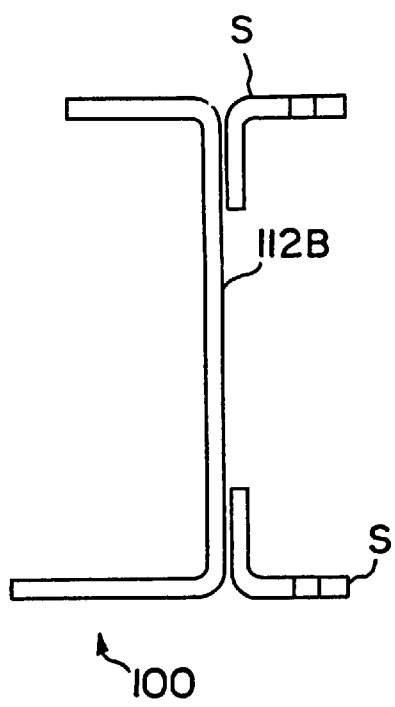
FIG. 6B is a horizontal cross-sectional view through one of the upstanding frame members of an alternative embodiment of the equipment rack of the present invention showing the location of L-shaped mounting strips at the front and back corners thereof and the location of the mounting holes or apertures in each of the L-shaped mounting strips.
Figure 6C:
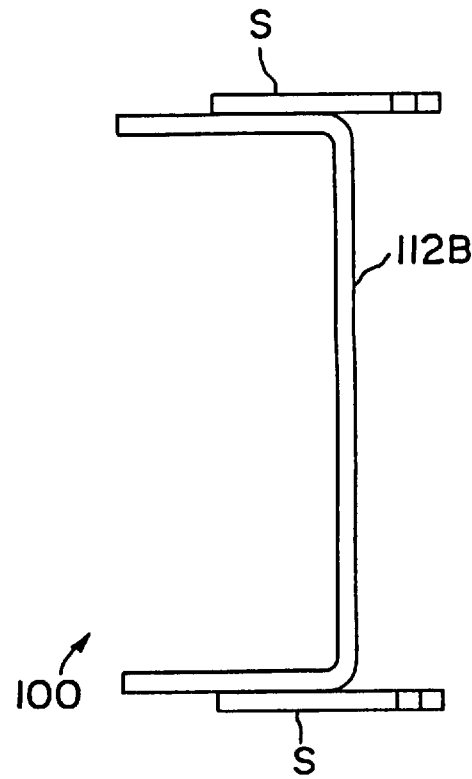
FIG. 6C is a horizontal cross-sectional view through one of the upstanding frame members of an alternative embodiment of the present invention showing the location of flat mounting strips at the front and back corners thereof and the location of the mounting holes or apertures in each of the flat mounting strips.

Referring now to FIGS. 6B, 6C, an alternative embodiment of the equipment rack of the present invention is shown and generally designated 100. Equipment rack 100 is formed from upright metal C-shaped channels as can be seen in FIGS. 6B, 6C. FIGS. 6B, 6C show two differently shaped mounting strips S attached in alternative manners to C-shaped upright metal channels 112A, 112B. FIG. 6B depicts securement of L-shaped strips S to the C-shaped upright channels 112A, 112B, and FIG. 6C depicts fixation of flat mounting strips S to C-shaped upright channels 112A, 112B. The incorporation of C-shaped upright channels 112A, 112B and the depicted affixation of L-shaped mounting strips S (FIG. 6B) and flat mounting strips S (FIG. 6C) thereto provide an alternative embodiment of the present invention and are intended to be within the scope of the present invention as set forth in the claims appended hereto.

It will be understood that various details of the invention may be changed without departing from the scope of the invention. Furthermore, the foregoing description is for the purpose of illustration only, and not for the purpose of limitation-the invention being defined by the claims.

What is claimed is:

1. In a rack assembly for mounting telecommunications equipment of the type comprising: a pair of upstanding spaced-apart frame members wherein each of said frame members defines an upper and a lower end and an inside wall and an outside wall; a horizontal frame member extending between the top ends of said pair of upstanding spaced-apart frame members; and a base provided at the bottom of said rack assembly, the improvement wherein said pair of upstanding frame members comprises:

(a) a pair of upstanding spaced-apart frame members with a generally U-shaped cross-section comprising a web having a bottom with a relatively short side portion on one side and a relatively long side portion on the other side, and the side portions of each of said frame members being outwardly directed relative to the side portions of the other of said frame members and the rack assembly, wherein each of said frame members forms a front and rear corner at the juncture of the web bottom with the long and short web side portions, respectively;

(b) a plurality of mounting strips secured in a corresponding plurality of said front and rear corners, each of said strips defining a plurality of spaced-apart mounting holes or apertures therein; whereby said rack assembly provides mounting holes or apertures in a desired proximity to the inside wall of each of said pair of upright spaced-apart frame members to facilitate mounting selected equipment in said rack assembly.

2. In a rack assembly according to claim 1, wherein each of said frame members defines a longitudinally extending channel at the front and back corner thereof and said plurality of mounting strips are secured to a corresponding plurality of said longitudinally extending channels, and wherein said longitudinally extending channels at the front and rear corners of each of said frame members are each defined by inwardly turned and perpendicularly intersecting edges of the corresponding web bottom and web side portions.

3. In a rack assembly according to claim 2, wherein said mounting strips each define an L-shaped cross-section and wherein said mounting strips are each affixed within a corresponding longitudinally extending channel so that one side of said L-shaped cross-section extends substantially parallel and co-planar with the corresponding web side portion of said frame member.

4. In a rack assembly according to claim 1, wherein said telecommunications equipment is digital equipment.

5. In a rack assembly for mounting telecommunications equipment of the type comprising: a pair of upstanding spaced-apart frame members wherein each of said frame members defines an upper and a lower end and an inside wall and an outside wall; a horizontal frame member extending between the top ends of said pair of upstanding spaced-apart frame members; and a base provided at the bottom of said rack assembly, the improvement wherein said pair of upstanding frame members comprises:

(a) a pair of upstanding spaced-apart frame members with a generally U-shaped cross-section comprising a web having a bottom with a relatively short side portion on one side and a relatively long side portion on the other side, and the side portions of each of said frame members being outwardly directed relative to the side portions of the other of said frame members and the rack assembly, wherein each of said frame members forms a front and rear corner at the juncture of the web bottom with the long and short web side portions, respectively, and each of said frame members defines a longitudinally extending channel at the front and back corner thereof, said longitudinally extending channels each defined by inwardly turned and perpendicularly intersecting edges of the corresponding web bottom and web side portions; and (b) a plurality of mounting strips secured in a corresponding plurality of said longitudinally extending channels, each of said strips defining a plurality of spaced-apart mounting apertures therein, said mounting strips each defining an L-shaped cross-section and wherein said mounting strips are each affixed within a corresponding longitudinally extending channel so that one side of said L-shaped cross-section extends substantially parallel and co-planar with the corresponding web side portion of said frame member;

whereby said rack assembly provides mounting apertures in a desired proximity to the inside wall of each of said pair of upright spaced-apart frame members to facilitate mounting selected equipment in said rack assembly.

6. In a rack assembly according to claim 5, wherein said telecommunications equipment is digital equipment.

7. A rack assembly for mounting telecommunications equipment thereon comprising:

(a) a pair of upstanding spaced-apart frame members each with an inside wall and an outside wall and a generally U-shaped cross-section comprising a web having a bottom with a relatively short side portion on one side and a relatively long side portion on the other side, and the side portions of each of said frame members being outwardly directed relative to the side portions of the other of said frame members and the rack assembly, wherein each of said frame members forms a front and rear corner at the juncture of the web bottom with the long and short web side portions, respectively;

(b) a plurality of strips mounted to a corresponding plurality of said front and rear corners, each of said strips defining a plurality of spaced-apart mounting apertures therein;

(c) a horizontal frame member secured at each opposing end to the upper end of a respective one of said pair of upstanding spaced-apart frame members; and (d) a base provided at the bottom of said rack assembly and extending between the lower ends of said pair of upstanding spaced-apart frame members;

whereby said rack assembly provides mounting apertures in a desired proximity to the inside wall of each of said pair of spaced-apart frame members to facilitate mounting selected equipment in said rack assembly.

8. The rack assembly according to claim 7, wherein each of said frame members defines a longitudinally extending channel at the front and rear corners thereof, and said plurality of mounting strips are secured to a corresponding plurality of said longitudinally extending channels, and wherein said longitudinally extending channels at the front and rear corners of each of said frame members are each defined by inwardly turned and perpendicularly intersecting edges of the corresponding web bottom and web side portions.

9. The rack assembly according to claim 8, wherein said mounting strips each define an L-shaped cross-section and wherein said mounting strips are each affixed within a corresponding longitudinally extending channel so that one side of said L-shaped cross-section extends substantially parallel and co-planar with the corresponding web side portion of said frame member.

10. The rack assembly according to claim 7, wherein said telecommunications equipment is digital equipment.

11. The rack assembly according to claim 7, wherein said base may be selected from the group consisting of a 4-inch tall Netbay base and a 6-inch tall UFER base.

12. A rack assembly for mounting telecommunications equipment thereon comprising:

(a) a pair of upstanding spaced-apart frame members each with an inside wall and an outside wall and a generally U-shaped cross-section comprising a web having a bottom with a relatively short side portion on one side and a relatively long side portion on the other side, and the side portions of each of said frame members being outwardly directed relative to the side portions of the other of said frame members and the rack assembly, wherein each of said frame members forms a front and rear corner at the juncture of the web bottom with the long and short web side portions, respectively, and each of said frame members defines a longitudinally extending channel at the front and back corner thereof;.

(b) a plurality of strips mounted in a corresponding plurality of said longitudinally extending channels, each of said strips defining a plurality of spaced-apart mounting apertures therein;

(c) a horizontal frame member secured at each opposing end to the upper end of a respective one of said pair of upstanding spaced-apart frame members; and (d) a base provided at the bottom of said rack assembly and extending between the lower ends of said pair of upstanding spaced-apart frame members, said base being selectable from the group consisting of a 4-inch tall Netbay base and a 6-inch tall UFER base;

whereby said rack assembly provides mounting apertures in a desired proximity to the inside wall of each of said pair of spaced-apart frame members to facilitate mounting selected equipment in said rack assembly.

13. The rack assembly according to claim 12, wherein said longitudinally extending channels at the front and rear corners of each of said frame members are each defined by inwardly turned and perpendicularly intersecting edges of the corresponding web bottom and web side portions.

14. The rack assembly according to claim 13, wherein said mounting strips each define an L-shaped cross-section and wherein said mounting strips are each affixed within a corresponding longitudinally extending channel so that one side of said L-shaped cross-section extends substantially parallel and coplanar with the corresponding web side portion of said frame member.

15. The rack assembly according to claim 12, wherein said telecommunications equipment is digital equipment.

* * * * *